US008786482B1

(12) United States Patent
Bartel et al.

(10) Patent No.: US 8,786,482 B1
(45) Date of Patent: Jul. 22, 2014

(54) INTEGRATED CIRCUIT WITH PIN FOR SETTING DIGITAL ADDRESS

(71) Applicant: Lattice Semiconductor Corporation, Hillsboro, OR (US)

(72) Inventors: Robert Bartel, Beaverton, OR (US); Spiro Sassalos, Tigard, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/857,919

(22) Filed: Apr. 5, 2013

Related U.S. Application Data

(60) Provisional application No. 61/714,636, filed on Oct. 16, 2012.

(51) Int. Cl.
*H03M 1/12* (2006.01)
*H03M 1/00* (2006.01)
*H03M 1/34* (2006.01)

(52) U.S. Cl.
CPC .............. *H03M 1/34* (2013.01); *H03M 1/001* (2013.01)
USPC ........... 341/156; 341/121; 341/155; 341/130; 327/68; 327/77; 327/205; 361/179; 713/300

(58) Field of Classification Search
CPC ... H03M 1/001; H03M 1/0646; H03M 1/004; H03M 1/1205; H03M 1/34; H03M 1/362; H03M 1/366; H03M 1/368; H01L 2223/5444; H01L 23/66; H03F 2200/261; H03F 2203/45138; G06F 1/26; H03K 5/1536; H03K 17/30; H03K 3/01; H03K 17/962
USPC ...................... 341/121–155; 327/68, 77, 205; 361/179; 713/300
See application file for complete search history.

(56) References Cited

U.S. PATENT DOCUMENTS

| | | | |
|---|---|---|---|
| 5,525,985 A * | 6/1996 | Schlotterer et al. ........... 341/136 |
| 5,646,609 A | 7/1997 | O'Brien |
| 5,668,551 A * | 9/1997 | Garavan et al. ............... 341/120 |
| 5,751,234 A * | 5/1998 | Schlotterer et al. ........... 341/139 |
| 5,760,720 A * | 6/1998 | Nolan et al. .................. 341/120 |
| 5,774,733 A * | 6/1998 | Nolan et al. .................. 713/300 |
| 6,744,391 B2 * | 6/2004 | Mooney et al. ............... 341/126 |
| 6,801,146 B2 * | 10/2004 | Kernahan et al. ............. 341/122 |
| 6,812,880 B2 | 11/2004 | Paulus |
| 6,917,320 B2 * | 7/2005 | Roberts et al. ................ 341/143 |
| 6,970,794 B2 | 11/2005 | Sutardja |
| 7,456,409 B2 * | 11/2008 | Dhurjaty et al. ......... 250/370.09 |
| 7,764,053 B2 * | 7/2010 | Mehas et al. .................. 323/222 |
| 7,928,787 B2 * | 4/2011 | Mehas et al. .................. 327/205 |
| 8,339,173 B2 * | 12/2012 | Mehas et al. .................. 327/205 |
| 2004/0095264 A1 * | 5/2004 | Thomas ......................... 341/53 |
| 2009/0182920 A1 | 7/2009 | Chao |

* cited by examiner

*Primary Examiner* — Lam T Mai

(57) ABSTRACT

In one embodiment, an integrated circuit includes a pin and a current source for driving current through the pin into an external resistor such as a resistor on a circuit board to generate a pin voltage. The integrated circuit includes an analog-to-digital converter for converting the pin voltage into a digital value, such as an address for the integrated circuit.

20 Claims, 2 Drawing Sheets

INTEGRATED CIRCUIT WITH PIN FOR SETTING DIGITAL ADDRESS

RELATED APPLICATION

This application claims the benefit of U.S. Provisional Application No. 61/714,636, filed Oct. 16, 2012, which is incorporated herein in its entirety.

TECHNICAL FIELD

The present invention relates generally to integrated circuits, and more particularly to an integrated circuit adapted to provide a digital value responsive to a pin voltage.

BACKGROUND

Integrated circuit technology continues to shrink transistor size and thus pack more and more transistors onto a die. The resulting scaling provides the core of an integrated circuit with vast amounts of functionality. Such enhanced functionality requires ever more input and output signals. But the input and output pins for integrated circuits have not been scaled accordingly. Thus, a typical modern integrated circuit has a relatively small set of pins that must service more and more functionality for the integrated circuit's core.

Pin limitations on integrated circuits are thus a common design challenge. It is therefore advantageous to enhance integrated circuit design such that fewer pins are needed for a given functionality. The saved pins can then be devoted to other functions. For example, to function in the inter-integrated circuit (I2C) protocol, a device requires an I2C address. The generation of this address conventionally requires several pins. It would thus be advantageous if an integrated circuit could be configured to generate such an address using fewer pins. For example, if a device could receive an analog voltage at a single pin and convert this analog voltage into a digital address, the pin usage is minimized. But conventional analog-to-digital converters are costly and demand too much die space.

Accordingly, there is a need in the art for improved integrated circuits that can convert an analog voltage received on a single pin into a digital value.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
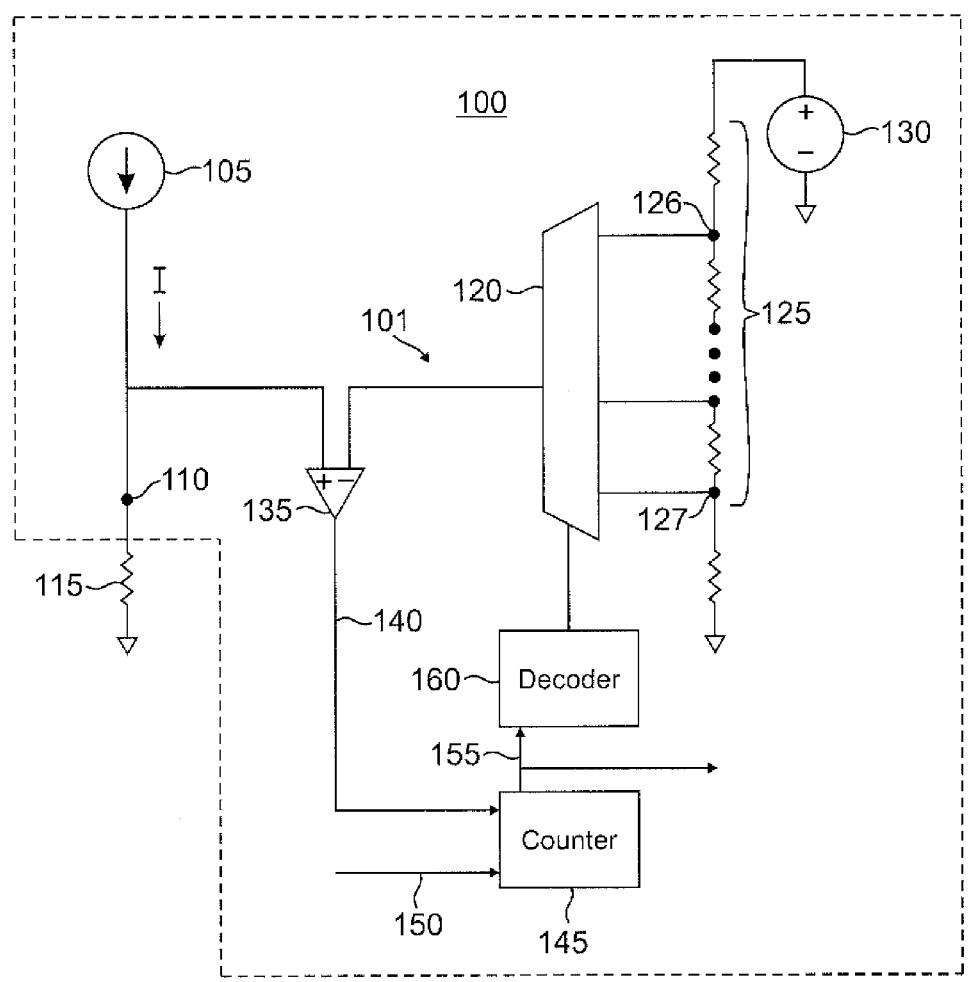
FIG. 1 is a schematic diagram for an integrated circuit having a single-pin analog-to-digital architecture.

Turning now to the drawings, FIG. 1 illustrates an integrated circuit 100 that includes a current source 105 driving a pin 110. To configure integrated circuit 100 with the appropriate digital value such as an address, a user need merely couple an external resistor 115 between pin 110 and ground on the printed circuit board (not illustrated) on which integrated circuit 100 is mounted. An analog-to-digital converter 101 in integrated circuit 100 digitizes the resulting analog voltage on pin 110 into a digital value that may be used as an address. This is quite advantageous in that integrated circuit 100 thus needs to devote just single pin 110 to the resulting address generation scheme.

As used herein, "pin" is used as a generic term to refer to whatever structure that is used to couple signals between integrated circuit 100 and external devices. Thus pin 100 may represent a ball-grid array (BGA) pad in addition to a physical pin or wire. Depending upon the magnitude for a current I from source 105 and the resistance for resistor 115, a pin voltage will develop across pin 110 according to Ohm's law. In one embodiment, the magnitude of the current I is fixed by current source 105 such as at a value of 100 µA. Given some fixed value of current I, the resistance selected for resistor 115 would then control the analog voltage that results on pin 110. For example, integrated circuit 100 may be configured to have a 3-bit digital value determined responsive to resistances for resistor 115 ranging from 2.2K to 18K ohms. Two additional resistances of zero and infinity would correspond to a user either grounding pin 110 or connecting it to the power supply on the circuit board. For these two end cases, there would of course be no actual coupling of a resistor 115 to pin 110.

Analog-to-digital converter 101 includes a multiplexer 120 that selects from taps on a series of resistors 125 arranged between a power supply 130 and ground. Multiplexer 120 selects for a maximum output voltage if it is controlled to select for an uppermost tap 126. Conversely, a minimum voltage is output by multiplexer 120 if multiplexer 120 selects for a lowest tap 127 because only a single resistor from the series of resistors 125 is coupled between tap 127 and ground. As multiplexer 120 is controlled to select for progressively higher taps, additional resistors are coupled between these successive taps and ground. In that regard, a maximum plurality of resistors in series 125 exists between uppermost tap 126 and ground. Thus, multiplexer 120 outputs the maximum voltage when uppermost tap 126 is selected.

A comparator 135 compares a difference of the voltage output from multiplexer 120 and the voltage from pin 110 to form a comparison voltage signal 140 accordingly. A counter 145 receives comparison voltage signal 140 as an enable signal and counts responsive to cycles of a system clock 150 to provide a count signal 155 that drives a decoder 160. Decoder 160 decodes count 155 to control multiplexer 120 to select for a corresponding tap on resistor series 125.

Although comparator 135 is an analog component, its gain is such that comparison voltage signal 140 functions as a digital signal. If the voltage for pin 110 is less than the output voltage from multiplexer 120, then comparison voltage signal 140 will be in a first binary state. Conversely if the voltage for pin 110 is greater than the output voltage from multiplexer 120, then comparison voltage signal 140 will be in a second binary state that is the complement of the first binary state. Thus, comparison voltage 140 is either a logical zero or one depending upon the whether the voltage of pin 110 is greater or less than the output voltage of multiplexer 120.

In a logic-high embodiment, counter 145 is enabled to count responsive to cycles of clock 150 when comparison voltage 140 is a logical one (at the power supply voltage for comparator 135). In response to the increasing count 155, decoder 160 would then command multiplexer 120 to select for higher and higher taps such that the output voltage of multiplexer 120 would increase accordingly. When a tap is selected such that the output voltage of multiplexer 120 exceeds the voltage of pin 110, comparison voltage 140 is brought low such that counter 145 stops counting. Count 155 may then be used as a digital address such as for an I2C address. For example, counter 145 may be a 3-bit counter such that count 155 is a 3-bit address. Decoder 160 for such an embodiment would then be a 3×8 decoder. Similarly, multiplexer 120 would be an 8:1 multiplexer for a 3-bit count 155. The number of bits may be increased by having additional taps (and corresponding resistors) in resistor series 125.

Should pin 110 be tied to the power supply (VDD) on the circuit board, the output voltage for multiplexer 120 would always be less than the voltage for pin 110 since a resistor lies between uppermost tap 126 and power supply 130. In that case, counter 145 would simply saturate at its maximum count such as eight for a 3-bit embodiment. Conversely, if pin 110 is tied to ground (VSS), the output voltage for multiplexer 120 would always be higher than the voltage for pin 110 such that counter 145 would never be enabled to count. In that case, count 155 would simply be zero.

The following table provides the resistor values for a 3-bit address generation embodiment in which current source 105 is a 100 μA current source.

| Resistance value | Voltage on pin 110 | Generated address |
|---|---|---|
| None | VSS | 0 |
| 2.2K | 0.22 V | 1 |
| 4.4K | 0.44 V | 2 |
| 7K | 0.70 V | 3 |
| 10K | 1.00 V | 4 |
| 14K | 1.40 V | 5 |
| 18K | 1.80 V | 6 |
| None | VDD | 7 |

Figure 2:
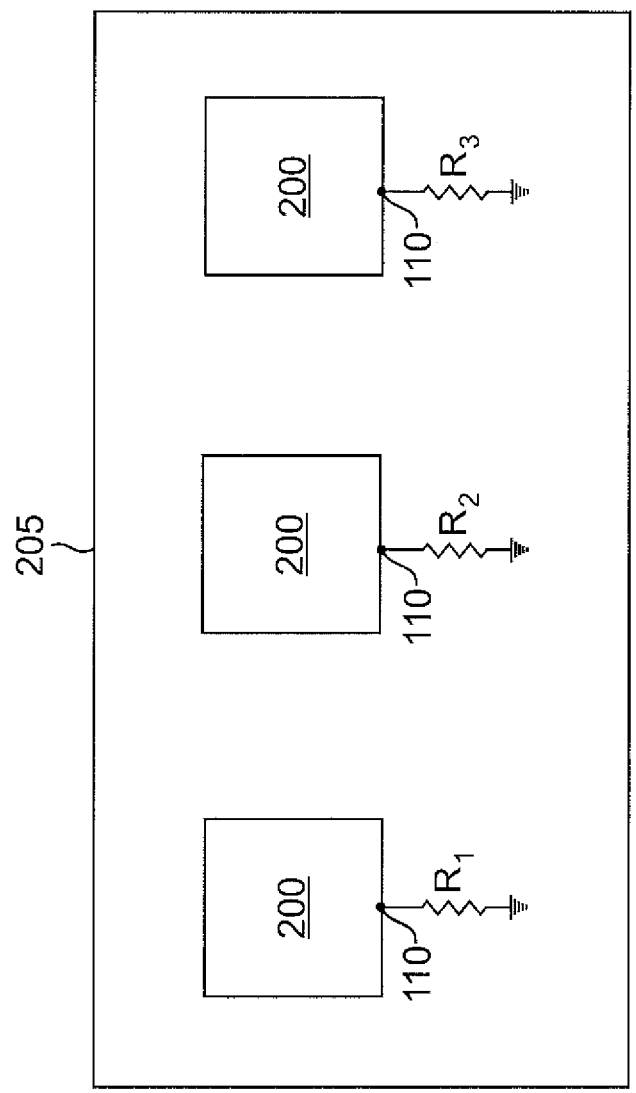
FIG. 2 illustrates a plurality of integrated circuits on a circuit board, wherein each integrated circuit includes the single-pin architecture of FIG. 1.

FIG. 2 illustrates the corresponding arrangement of three integrated circuits 200 each having a pin 110 driven as discussed with regard to FIG. 1 on a circuit board 205. By appropriate selection of resistances R1, R2, and R3, a user may provide digital addresses to devices 200 in a simple and effective manner using just single pins 110. A wide variety of integrated circuits may benefit in this fashion. For example, each integrated circuit may comprise a field programmable gate array (FPGA) or other type of integrated circuit.

It will be appreciated that the techniques and concepts discussed herein are not limited to the specific disclosed embodiments. For example, from this disclosure it is evident that the invention could also implemented with a current source 105 that is variable and external resistors 115 that have the same resistance. The appended claims encompass all such changes and modifications as fall within the true spirit and scope of this invention.

We claim:

1. An integrated circuit, comprising:
   a pin;
   a current source within the integrated circuit configured to drive a current through the pin; and
   an analog-to-digital converter within the integrated circuit configured to compare a voltage of the pin to a succession of internal voltages to provide a digital value.

2. The integrated circuit of claim 1, wherein the analog-to-digital converter includes a counter for providing a count as the digital value.

3. The integrated circuit of claim 2, wherein the analog-to-digital converter further includes a multiplexer for selecting a tap on a series of resistors responsive to the count.

4. The integrated circuit of claim 2, wherein the analog-to-digital converter further includes a comparator configured to drive an enable signal to the counter responsive to a comparison of the voltage of the pin and the internal voltage.

5. The integrated circuit of claim 4, wherein the analog-to-digital converter further includes a decoder configured to drive a multiplexer responsive to the count.

6. The integrated circuit of claim 4, wherein the counter is configured to increment the count responsive to cycles of a clock.

7. The integrated circuit of claim 5, wherein the analog-to-digital converter further includes a tapped series of resistors, and wherein the multiplexer is configured to select one of the taps responsive to the decoder decoding the count.

8. The integrated circuit of claim 7, wherein integrated circuit is configured to use the count as an address.

9. The integrated circuit of claim 8, wherein the address is an I2C address.

10. The integrated circuit of claim 1, wherein the current source is a fixed current source.

11. A method, comprising:
    driving an internal current generated within an integrated circuit through a pin of the integrated circuit into a resistor external to the integrated circuit to generate a pin voltage on the pin; and
    in the integrated circuit, converting the pin voltage into a digital value,
    wherein converting the pin voltage into a digital value comprises comparing the pin voltage to a succession of different voltages within the integrated circuit.

12. The method of claim 11, wherein comparing the pin voltage to a succession of different voltages continues until one of the different voltages is greater than the pin voltage.

13. The method of claim 11, further comprising successively selecting taps on a series of resistors to provide the succession of different voltages.

14. The method of claim 11, wherein converting the pin voltage into a digital value comprises counting a clock cycle for each successive different voltage.

15. The method of claim 13, wherein successively selecting taps on a series of resistors comprises commanding a multiplexer to successively select the taps.

16. An integrated circuit, comprising:
    a pin;
    a current source within the integrated circuit configured to drive a current through the pin; and
    an analog-to-digital converter within the integrated circuit, the analog-to-digital converter including:
    a comparator configured to compare a voltage on the pin to an internal voltage;
    a counter responsive to the comparator to provide a digital value; and
    a multiplexer responsive to the counter and configured to select the internal voltage for comparison to the voltage on the pin.

17. The integrated circuit of claim 16 including a decoder coupled between the counter and the multiplexer and configured to decode the digital value of the counter to control the selection of the internal voltage by the multiplexer.

18. The integrated circuit of claim 16, wherein the analog-to-digital converter further includes a tapped series of resistors, and wherein the multiplexer is configured to select one of the taps in selecting the internal voltage.

19. The integrated circuit of claim 16, wherein the counter is configured to provide a count signal in response to the comparator and cycles of a clock.

20. The integrated circuit of claim 16, wherein the multiplexer is configured to select a succession of different internal voltages in response to changes in a count signal of the counter.

* * * * *